(12) United States Patent
Yoshii et al.

(10) Patent No.: US 8,582,083 B2
(45) Date of Patent: Nov. 12, 2013

(54) EFFECTIVE LIGHT SOURCE SHAPE DATABASE GENERATION METHOD, OPTICAL IMAGE CALCULATION METHOD, RECORDING MEDIUM, EXPOSURE METHOD, AND DEVICE FABRICATION METHOD

(75) Inventors: Hiroto Yoshii, Chofu (JP); Kouichirou Tsujita, Utsunomiya (JP); Koji Mikami, Nikko (JP)

(73) Assignee: Canon Kabushiki Kaisha, Tokyo (JP)

( * ) Notice: Subject to any disclaimer, the term of this patent is extended or adjusted under 35 U.S.C. 154(b) by 865 days.

(21) Appl. No.: 12/369,472

(22) Filed: Feb. 11, 2009

(65) Prior Publication Data
US 2009/0231562 A1    Sep. 17, 2009

(30) Foreign Application Priority Data
Feb. 13, 2008   (JP) .................. 2008-032348

(51) Int. Cl.
*G03B 27/54* (2006.01)
(52) U.S. Cl.
USPC .................. 355/67; 355/53; 355/77
(58) Field of Classification Search
USPC .......... 355/30, 46, 52, 53, 55, 67–71, 77, 355/492.1, 492.2, 548; 430/30; 250/492.1, 250/492.2, 548
See application file for complete search history.

(56) References Cited

U.S. PATENT DOCUMENTS

| | | | |
|---|---|---|---|
| 5,680,588 A | 10/1997 | Gortych et al. | |
| 7,196,801 B1 * | 3/2007 | Janik et al. | 356/606 |
| 7,213,226 B2 | 5/2007 | Kotani et al. | |
| 2001/0048512 A1 * | 12/2001 | Suzuki et al. | 355/53 |
| 2004/0229133 A1 | 11/2004 | Socha et al. | |
| 2005/0024612 A1 * | 2/2005 | Hirukawa et al. | 355/55 |
| 2005/0142470 A1 | 6/2005 | Socha et al. | |
| 2005/0190350 A1 * | 9/2005 | Shinoda | 355/53 |
| 2006/0046168 A1 * | 3/2006 | Fukuhara | 430/30 |
| 2006/0221319 A1 * | 10/2006 | Yamaguchi et al. | 355/55 |
| 2007/0034816 A1 * | 2/2007 | Brill et al. | 250/548 |
| 2007/0146676 A1 * | 6/2007 | Tanitsu et al. | 355/71 |
| 2008/0007725 A1 * | 1/2008 | Togashi et al. | 356/237.2 |

FOREIGN PATENT DOCUMENTS

| | | |
|---|---|---|
| JP | 3342631 B | 11/2002 |
| JP | 2005-062750 A | 3/2005 |
| JP | 2005-183981 A | 7/2005 |

OTHER PUBLICATIONS

Cobb, et al., "Mathematical and CAD Framework for Proximity Correction", Optical Microlithography, 1996, p. 208-222 SPIE vol. 2726.

* cited by examiner

*Primary Examiner* — Toan Ton
*Assistant Examiner* — Mona M Sanei
(74) *Attorney, Agent, or Firm* — Canon USA Inc IP Division

(57) ABSTRACT

The present invention provides a method of generating a database of effective light source shapes including a generation step of generating an initial database representing an effective light source shapes corresponding to a plurality of conditions settable for an illumination optical system, a measurement step of setting an arbitrary condition for the illumination optical system, and measuring an effective light source shape, a calculation step of calculating a difference amount between an effective light source shape when each of the plurality of conditions is set for the illumination optical system and the effective light source shape included in the initial database, and a correction step of correcting the effective light source shapes included in the initial database using the difference amounts and compiling the corrected effective light source shapes into an actual database.

11 Claims, 16 Drawing Sheets

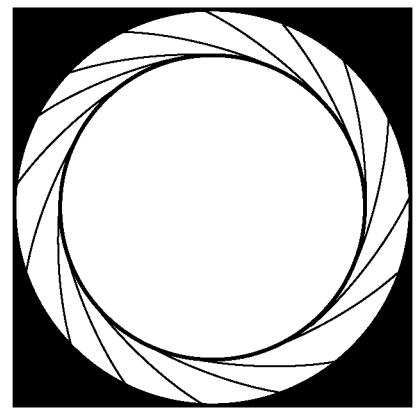
F I G. 14A
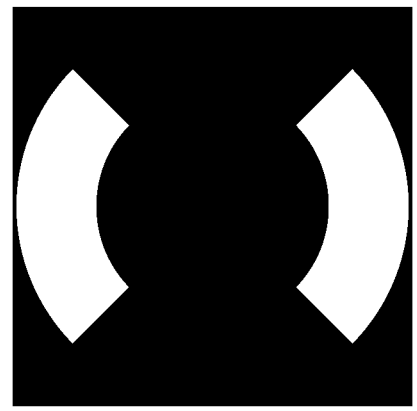
F I G. 14B
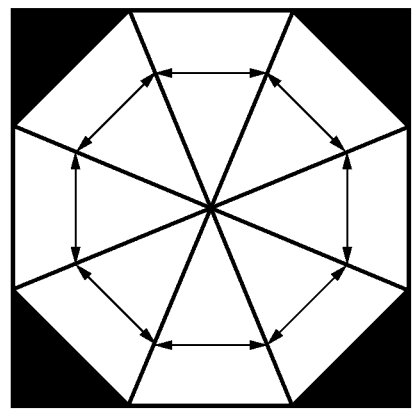
F I G. 14C

F I G. 17
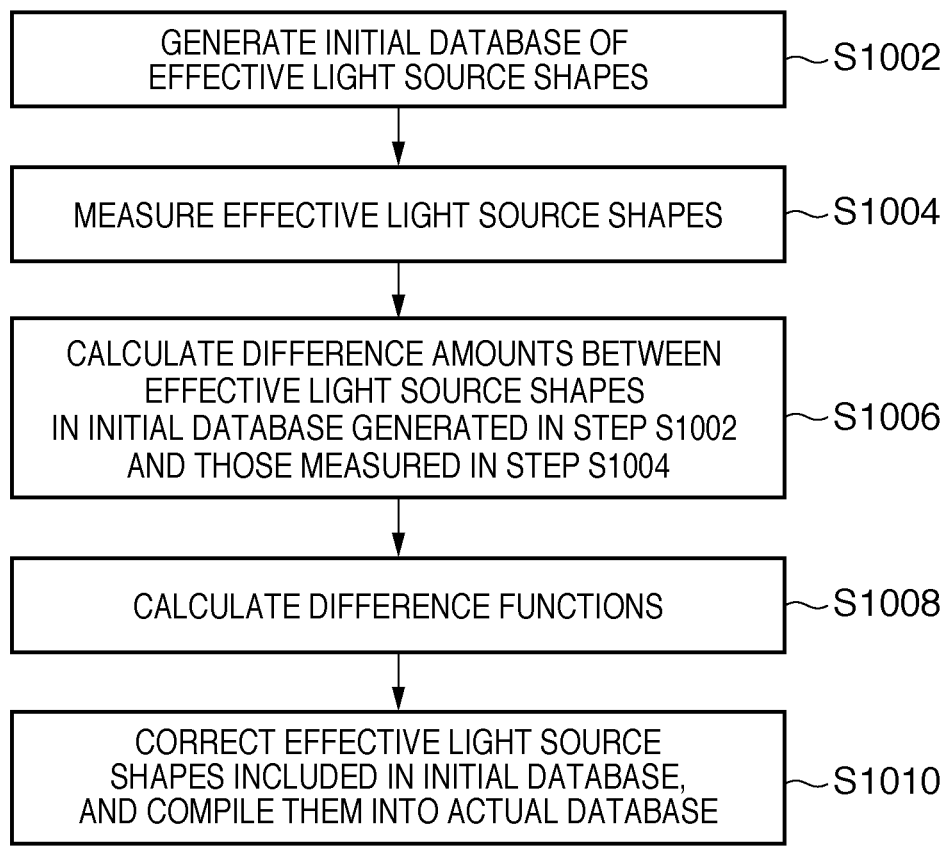

EFFECTIVE LIGHT SOURCE SHAPE DATABASE GENERATION METHOD, OPTICAL IMAGE CALCULATION METHOD, RECORDING MEDIUM, EXPOSURE METHOD, AND DEVICE FABRICATION METHOD

BACKGROUND OF THE INVENTION

1. Field of the Invention

The present invention relates to an effective light source shape database generation method, an optical image calculation method, a recording medium, an exposure method, and a device fabrication method.

2. Description of the Related Art

A projection exposure apparatus which projects and transfers a circuit pattern formed on an original (reticle or mask) onto a substrate such as a wafer by a projection optical system is employed to manufacture a semiconductor device by using photolithography. The recent projection exposure apparatuses use resolution-enhanced techniques in order to cope with advances in the micropatterning of semiconductor devices (that is, to attain a high resolution).

Examples of the resolution-enhanced techniques are OAI (Off-Axis Illumination) techniques called modified illumination and oblique illumination, and OPC (Optical Proximity Correction) techniques. The OAI techniques obliquely irradiate the reticle with light by setting the illumination shape (illumination condition) to an annular shape or a multipole shape (for example, a dipole shape or a quadrupole shape). In addition, the OPC techniques correct the shape of an original pattern in accordance with a rule-based system or a model-based system using optical simulation by taking account of the influence of the shape of each pattern element and its peripheral elements on the shape precision in the design of the original pattern.

An original pattern is generally designed in accordance with the exposure conditions including, for example, the illumination shape and the numerical aperture (NA) of the projection optical system. Note that the diffraction direction and intensity of the light from the original change upon correcting the shape of the original pattern using the OPC techniques, so the illumination shape is often adjusted in order to form an optical image with a higher precision on the wafer (so as to form a desired illumination shape on the wafer). Under the circumstance, an original pattern is designed using, for example, a simulator which statistically derives the illumination shape by repeating the correction of the pattern shape (that is, the evaluation of the original pattern) by the OPC techniques and the adjustment of the illumination shape (see Japanese Patent No. 3342631 and Japanese Patent Laid-Open No. 2005-183981). Especially, Japanese Patent Laid-Open No. 2005-183981 discloses a technique for attaining optimization of the illumination shape by taking account of the OPC techniques, and therefore contributes to reducing a load on the design of an original pattern.

Such a simulator is called a lithography simulator and includes an optical calculation unit which performs arithmetic operation involved in optical factors and a non-optical calculation unit which performs arithmetic operations involved in non-optical factors (see Japanese Patent Laid-Open No. 2005-62750 and "Mathematical and CAD Framework for Proximity Correction" (1996, SPIE Vol. 2726, pp. 208-222, Optical Microlithography)). The optical calculation unit predicts an optical image to be formed on the wafer by an exposure optical system. The non-optical calculation unit includes a development calculation unit which predicts a process of developing a photosensitive agent (resist) applied on the wafer from the optical image calculated by the optical calculation unit, and a feature size calculation unit which predicts a change in the feature size of the pattern after the developed resist is etched.

To accurately predict the feature size of a pattern to be formed on the wafer, both the optical calculation unit and the non-optical calculation unit require calculation models with higher precisions. For example, the optical calculation unit adopts a vector calculation model. Also, various efforts are made to improve the model accuracy of each process modeled in the development calculation unit.

To improve the precision of a pattern formed on the wafer, it is demanded not only to precisely control the illumination shape and the design of an original by the OPC techniques but also to improve the calculation accuracy of the lithography simulator. To meet these demands, the optical calculation unit of the lithography simulator needs to obtain (calculate) a high-precision optical image. To achieve this object, an actual effective light source shape in the projection exposure apparatus is preferably used as an effective light source shape input to the lithography simulator.

However, the conventional lithography simulator receives an effective light source shape calculated from the design values and the arrangement of optical elements which constitute an illumination optical system. More specifically, this simulator calculates the effective light source shapes for respective conditions (for example, the selection and arrangement of optical elements) settable for (the optical elements which constitute) an illumination optical system, and compiles them into a database, thereby selecting and receiving one effective light source shape from the database in accordance with actually set conditions. Note that actual effective light source shapes in the projection exposure apparatus change depending on design factors (for example, manufacturing errors and arrangement errors) of the exposure optical system, so they differ from the effective light source shapes calculated from conditions settable for the illumination optical system.

It is plausible to measure actual effective light source shapes in the projection exposure apparatus for respective conditions settable for the illumination optical system, and compile them into a database. However, this is impractical because a large number of conditions are settable for the illumination optical system, so a considerable amount of time is taken to measure the effective light source shapes.

It is also plausible to measure only effective light source shapes corresponding to actually set conditions of conditions settable for the illumination optical system. However, conditions such as the illumination shape (that is, the conditions of the illumination optical system) are frequently changed in the design of an original pattern using, for example, the OPC techniques. This makes it necessary to measure the effective light source shape for every change of these conditions. In view of this, that solution is also impractical because it is impossible to dramatically decrease the number of times of measurement of the effective light source shape even when only effective light source shapes corresponding to conditions actually set for the illumination optical system are measured (that is, it takes much time to measure the effective light source shapes).

SUMMARY OF THE INVENTION

The present invention provides a technique which can easily generate a database of effective light source shapes which can improve the calculation accuracy of a lithography simulator.

According to the first aspect of the present invention, there is provided in an exposure apparatus including an illumination optical system which illuminates an original with light from a light source, and a projection optical system which projects a pattern of the original onto a substrate, a method of generating a database of effective light source shapes formed in the illumination optical system, the method comprises a generation step of calculating effective light source shapes while changing a plurality of conditions settable for the illumination optical system, and generating an initial database representing the effective light source shapes corresponding to the plurality of conditions, a measurement step of setting an arbitrary condition of the plurality of conditions for the illumination optical system, and measuring an effective light source shape, a calculation step of calculating, based on the effective light source shape measured in the measurement step, and an effective light source shape corresponding to the arbitrary condition included in the initial database generated in the generation step, a difference amount between an effective light source shape when each of the plurality of conditions is set for the illumination optical system and the effective light source shape included in the initial database, and a correction step of correcting the effective light source shapes included in the initial database using the difference amounts calculated in the calculation step, and compiling the corrected effective light source shapes into an actual database.

According to the second aspect of the present invention, there is provided of a first exposure apparatus and a second exposure apparatus each including an illumination optical system which illuminates an original with light from a light source, and a projection optical system which projects a pattern of the original onto a substrate, a method of generating a database of effective light source shapes formed in the illumination optical system of the second exposure apparatus, the method comprises an obtaining step of obtaining, as an initial database, a database representing effective light source shapes corresponding to a plurality of conditions settable for the illumination optical system of the first exposure apparatus, a measurement step of setting, for the illumination optical system of the second exposure apparatus, an arbitrary condition of the plurality of conditions settable for the illumination optical system of the second exposure apparatus, and measuring an effective light source shape, a calculation step of calculating, based on the effective light source shape measured in the measurement step, and an effective light source shape corresponding to the arbitrary condition included in the initial database obtained in the obtaining step, a difference amount between an effective light source shape when each of the plurality of conditions is set for the illumination optical system of the second exposure apparatus and the effective light source shape included in the initial database, and a correction step of correcting the effective light source shapes included in the initial database using the difference amounts calculated in the light source shapes into an actual database.

According to the third aspect of the present invention, there is provided a method of calculating an optical image formed on an image plane of a projection optical system in an exposure apparatus including an illumination optical system which illuminates an original with light from a light source, and the projection optical system which projects a pattern of the original onto the substrate, the method comprises a database generation step of generating a database of effective light source shapes formed in the illumination optical system, and a calculation step of receiving, as input information, the effective light source shapes included in the database generated in the database generation step, the pattern of the original, and information concerning the projection optical system, and calculating an optical image formed on the image plane of the projection optical system based on the input information, the database generation step including a generation step of calculating effective light source shapes while changing a plurality of conditions settable for the illumination optical system, and generating an initial database representing the effective light source shapes corresponding to the plurality of conditions, a measurement step of setting an arbitrary condition of the plurality of conditions for the illumination optical system, and measuring an effective light source shape, a calculation step of calculating, based on the effective light source shape measured in the measurement step, and an effective light source shape corresponding to the arbitrary condition included in the initial database generated in the generation step, a difference amount between an effective light source shape when each of the plurality of conditions is set for the illumination optical system and the effective light source shape included in the initial database, and a correction step of correcting the effective light source shapes included in the initial database using the difference amounts calculated in the calculation step, and compiling the corrected effective light source shapes into an actual database.

According to the fourth aspect of the present invention, there is provided a recording medium recording a program for making a computer calculate an optical image formed on an image plane of a projection optical in an exposure apparatus including an illumination optical system which illuminates an original with light from a light source, and the projection optical system which projects a pattern of the original onto the substrate, the program making the computer execute a database generation step of generating a database of effective light source shapes formed in the illumination optical system, and a calculation step of receiving, as input information, the effective light source shapes included in the database generated in the database generation step, the pattern of the original, and information concerning the projection optical system, and calculating an optical image formed on the image plane of the projection optical system based on the input information, wherein the database generation step includes a generation step of calculating effective light source shapes while changing a plurality of conditions settable for the illumination optical system, and generating an initial database representing the effective light source shapes corresponding to the plurality of conditions, a measurement step of setting an arbitrary condition of the plurality of conditions for the illumination optical system, and measuring an effective light source shape, a calculation step of calculating, based on the effective light source shape measured in the measurement step, and an effective light source shape corresponding to the arbitrary condition included in the initial database generated in the generation step, a difference amount between an effective light source shape when each of the plurality of conditions is set for the illumination optical system and the effective light source shape included in the initial database, and a correction step of correcting the effective light source shapes included in the initial database using the difference amounts calculated in the calculation step, and compiling the corrected effective light source shapes into an actual database.

According to the fifth aspect of the present invention, there is provided an exposure method for an exposure apparatus including an illumination optical system which illuminates an original with light from a light source, and a projection optical system which projects a pattern of the original onto a substrate, the method comprises a database generation step of generating a database of effective light source shapes formed in the illumination optical system, a calculation step of receiving, as input information, the effective light source shapes included in the database generated in the database generation step, the pattern of the original, and information concerning the projection optical system, and calculating an optical image formed on an image plane of the projection optical system based on the input information, a setting step of setting an exposure condition of the exposure apparatus based on evaluation of the optical image calculated in the calculation step, an illumination step of illuminating the original under the exposure condition set in the setting step, and a projection step of projecting an image of the pattern of the original illuminated in the illumination step onto the substrate via the projection optical system, wherein the database generation step includes a generation step of calculating effective light source shapes while changing a plurality of conditions settable for the illumination optical system, and generating an initial database representing the effective light source shapes corresponding to the plurality of conditions, a measurement step of setting an arbitrary condition of the plurality of conditions for the illumination optical system, and measuring an effective light source shape, a calculation step of calculating, based on the effective light source shape measured in the measurement step, and an effective light source shape corresponding to the arbitrary condition included in the initial database generated in the generation step, a difference amount between an effective light source shape when each of the plurality of conditions is set for the illumination optical system and the effective light source shape included in the initial database, and a correction step of correcting the effective light source shapes included in the initial database using the difference amounts calculated in the calculation step, and compiling the corrected effective light source shapes into an actual database.

According to the sixth aspect of the present invention, there is provided a device fabrication method comprising steps of exposing a substrate using the above exposure method, and performing a development process for the substrate exposed.

Further features of the present invention will become apparent from the following description of exemplary embodiments with reference to the attached drawings.

BRIEF DESCRIPTION OF THE DRAWINGS

FIGS. 14A to 14C are views each showing the configuration of the stop member.

FIG. 17 is a flowchart for explaining a method of generating a database of effective light source shapes formed in an illumination optical system of the exposure apparatus shown in FIG. 1.

DESCRIPTION OF THE EMBODIMENT

Figure 1:
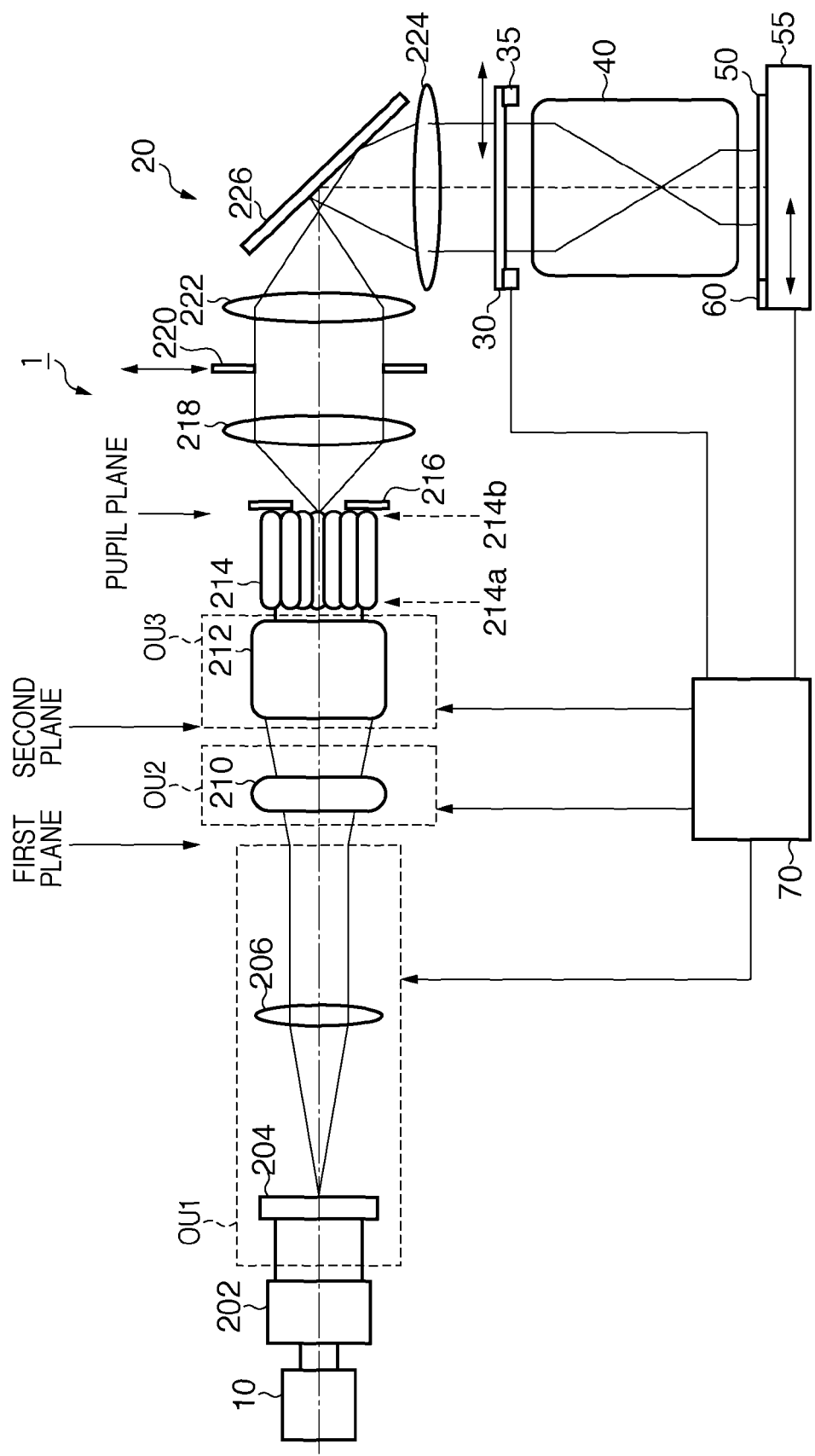
FIG. 1 a schematic sectional view showing an exposure apparatus.

A preferred embodiment of the present invention will be described below with reference to the accompanying drawings. The same reference numerals denote the same members throughout the drawings, and a repetitive description thereof will not be given.

FIG. 1 is a schematic sectional view showing an exposure apparatus 1. In this embodiment, the exposure apparatus 1 is a projection exposure apparatus which transfers the pattern of a reticle 30 onto a wafer 50 by the step & scan scheme. However, the exposure apparatus 1 can adopt the step & repeat scheme or another exposure scheme.

The exposure apparatus 1 includes a light source 10, an illumination optical system 20, a reticle stage 35 for mounting the reticle 30, a projection optical system 40, a wafer stage 55 for mounting the wafer 50, a detection unit 60, and a control unit 70.

The light source 10 is, for example, an excimer laser. The excimer laser includes, for example, a KrF excimer laser having a wavelength of about 248 nm, and an ArF excimer laser having a wavelength of about 193 nm. However, the light source 10 is not particularly limited to an excimer laser, and may be, for example, a superhigh pressure mercury lamp or an $F_2$ laser having a wavelength of about 157 nm.

The illumination optical system 20 illuminates the reticle 30 with light from the light source 10. The illumination optical system 20 includes a shaping optical system 202, diffraction optical element 204, Fourier transform lens 206, illumination shape conversion unit 210, and zoom optical system 212. The illumination optical system 20 also includes a fly-eye lens 214, stop member 216, illumination lens 218, field stop 220, imaging lenses 222 and 224, and deflecting mirror 226.

The shaping optical system 202 converts light from the light source 10 into that having a desired shape, and guides it to the diffraction optical element 204.

The diffraction optical element 204 is designed to form a desired light intensity distribution on a plane which holds a Fourier transform relationship with it upon receiving collimated light. In this embodiment, the light from the diffraction optical element 204 forms a first light intensity distribution on a first plane via the Fourier transform lens 206. The diffraction optical element 204 can be switched in accordance with an effective light source shape formed on the pupil plane of the projection optical system 40.

The illumination shape conversion unit 210 includes optical elements (for example, a plurality of prisms) which convert the light from the first plane (first light intensity distribution) into that having an annular shape or quadrupole shape in accordance with the illumination condition (for example, circular illumination, annular illumination, dipole illumination, or quadrupole illumination). The light from the illumination shape conversion unit 210 forms a second light intensity distribution on a second plane. The detailed arrangement of the illumination shape conversion unit 210 will be described in detail later.

The zoom optical system 212 is set to hold an optically conjugate relationship with the fly-eye lens 214 (more specifically, an incident surface 214a of the fly-eye lens 214), and forms an image of the second light intensity distribution on the incident surface 214a of the fly-eye lens 214 at a predetermined magnification. In this embodiment, the zoom optical system 212 includes variable magnification zoom lenses and can adjust the region of the light which enters the fly-eye lens 214.

The fly-eye lens 214 is formed by two-dimensionally arraying a plurality of microlenses. In this embodiment, an exit surface 214b of the fly-eye lens 214 matches the pupil plane of the illumination optical system 20. The fly-eye lens 214 forms a pupil plane distribution on the exit surface 214b.

The stop member 216 is set near the exit surface 214b of the fly-eye lens 214, and adjusts the shape of the pupil plane distribution by shielding any unnecessary light (that is, adjusts the shape of the pupil plane distribution to a desired shape). The stop member 216 can change the aperture size and shape via a driving mechanism (not shown). The stop member 216 may be set near the incident surface 214a of the fly-eye lens 214 or on a plane which holds a conjugate relationship with the pupil plane of the illumination optical system 20 and on which a first or second light intensity distribution is formed. Also, a plurality of stop members 216 may be set.

The illumination lens 218 illuminates the field stop 220 by superposing the pupil plane distribution formed near the exit surface 214b of the fly-eye lens 214 onto the field stop 220.

The field stop 220 includes a plurality of movable light-shielding plates and limits the illumination range (exposure range) on the reticle 30 serving as the illumination target surface (and ultimately, the wafer 50).

The imaging lenses 222 and 224 form an image of the light having passed through the aperture of the field stop 220 on the reticle 30 via the deflecting mirror 226.

The reticle 30 is an original which is fabricated using the OPC techniques and has a pattern (circuit pattern) to be transferred onto the wafer 50. The reticle 30 is supported and driven by the reticle stage 35. Diffracted light generated by the reticle 30 is projected onto the wafer 50 via the projection optical system 40. The reticle 30 and wafer 50 are set to hold an optically conjugate relationship. Since the exposure apparatus 1 is of the step & scan scheme, it transfers the pattern of the reticle 30 onto the wafer 50 by synchronously scanning them. For example, letting 1/β be the reduction magnification of the projection optical system 40, and V [mm/sec] be the scanning velocity of the wafer 50 (wafer stage 55), the scanning velocity of the reticle 30 (reticle stage 35) is βV [mm/sec]. Note that the field stop 220 is scanned in synchronism with the reticle 30 (reticle stage 35) and the wafer 50 (wafer stage 55).

The reticle stage 35 has a function of supporting the reticle 30 through a reticle chuck and driving (scanning) the reticle 30.

The projection optical system 40 projects the pattern of the reticle 30 onto the wafer 50. The projection optical system 40 can be a dioptric system, catadioptric system, or catoptric system.

The wafer 50 is a substrate onto which the pattern of the reticle 30 is projected (transferred), and is inserted on the exposure plane (the imaging plane of the projection optical system 40). However, the wafer 50 can be substituted by a glass plate or another substrate. The wafer 50 is coated with a resist.

The wafer stage 55 has a function of supporting the wafer 50 through a wafer chuck and driving (scanning) the wafer 50 in the optical axis direction of the projection optical system 40 and two-dimensionally in a plane perpendicular to the optical axis of the projection optical system 40.

The detection unit 60 includes, for example, an illuminometer and detects the amount of light (exposure light) which enters the wafer 50. The detection unit 60 is arranged on the wafer stage 55 such that its light-receiving surface matches the wafer surface, and is driven by the wafer stage 55. The detection unit 60 receives the light which enters the wafer 50, and sends a signal (detection result) according to the received light to the control unit 70. Also, the detection unit 60 can measure an effective light source shape formed in the illumination optical system 20 (more specifically, on the pupil plane of the illumination optical system 20).

The control unit 70 controls the overall operation of the exposure apparatus 1. The control unit 70 is electrically connected to, for example, the reticle stage 35 and wafer stage 55, and controls synchronous scanning between the reticle stage 35 and the wafer stage 55.

The control unit 70 includes, for example, a processing apparatus of a general-purpose computer. In this embodiment, the control unit 70 is installed with a program for executing, for example, a method of generating a database of effective light source shapes formed in the illumination optical system 20. The control unit 70 not only executes the effective light source shape database generation method, but also functions as a lithography simulator which uses the database of effective light source shapes generated by the generation method. More specifically, the control unit 70 receives, as input information, the effective light source shapes included in the generated database, the pattern of the reticle 30, and information concerning the projection optical system 40, and calculates an optical image formed on the wafer 50 based on the input information. The control unit 70 also has a function of evaluating the calculated optical image, and setting optimum exposure conditions for the exposure apparatus 1 based on the evaluation result (that is, a function of optimizing the exposure conditions).

Figure 2:
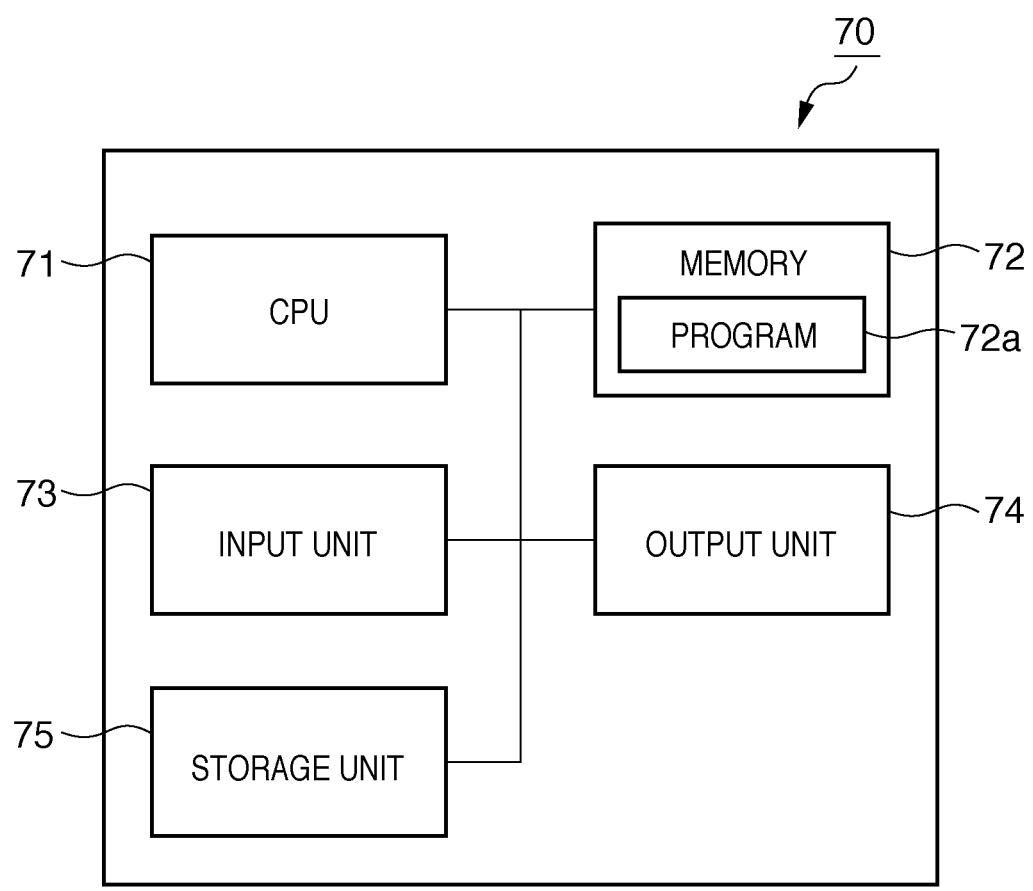
FIG. 2 is a view showing a control unit of the exposure apparatus shown in FIG. 1.

The control unit 70 includes a CPU 71, memory 72, input unit 73, output unit 74, and storage unit 75, as shown in FIG. 2. In this embodiment, the CPU 71 executes an effective light source shape database generation method, optical image calculation, and exposure condition optimization (to be described later), based on a program 72a stored in the memory 72. The memory 72 includes, for example, a ROM or RAM. The input unit 73 includes, for example, a keyboard, communication interface, and media reader. The output unit 74 includes, for example, a display, memory, and communication interface. The storage unit 75 includes, for example, a large-capacity storage unit such as a hard disk, and stores, for example, a database of effective light source shapes. The program 72a is loaded into the control unit 70 via, for example, the input unit 73 and written in the memory 72 in a predetermined format. Although the control unit 70 has all of a function of generating a database of effective light source shapes, a function as a lithography simulator which uses the database (optical image calculation and exposure condition optimization), and a function of controlling the overall operation of the exposure apparatus 1, the present invention is not particularly limited to this. In other words, a plurality of information processing apparatuses (control units) may be provided to assign the respective functions to them so that each information processing apparatus executes a single function.

The illumination optical system 20 which forms an effective light source (defines the effective light source shape), and an effective light source shape database generation method executed by the control unit 70 will be explained in detail below. In this embodiment, a unit including the diffraction optical element 204 and Fourier transform lens 206 will be referred to as a first optical unit OU1, that including the illumination shape conversion unit 210 will be referred to as a second optical unit OU2, and that including the zoom optical system 212 will be referred to as a third optical unit OU3. Accordingly, the first optical unit OU1 forms a "first light intensity distribution", the second optical unit OU2 forms a "second light intensity distribution", and the third optical unit OU3 forms a "pupil plane distribution". A pupil plane distribution shielded against any unnecessary light by the stop member 216 serves as the effective light source (effective light source shape). The effective light source shape is synonymous with the light angle distribution on the illumination target surface.

The first optical unit OU1, second optical unit OU2, and third optical unit OU3 convert light from the light source 10 into that having a desired shape, thereby controlling the intensity distribution and angle distribution of the light which enters the fly-eye lens 214 to desired distributions. This makes it possible to adjust the effective light source shape.

Figure 3:
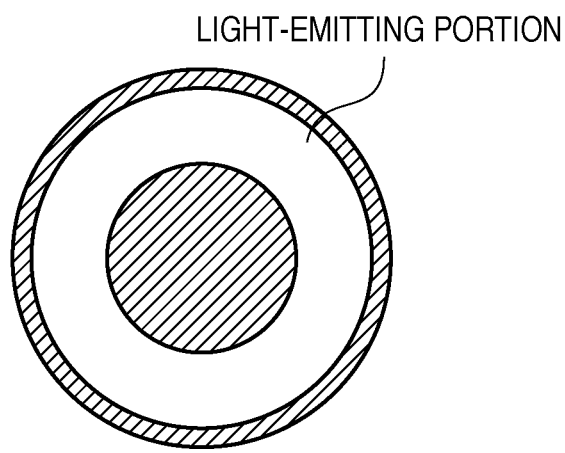
FIG. 3 is a view showing an example of the effective light source shape (an annular effective light source).
Figure 4:
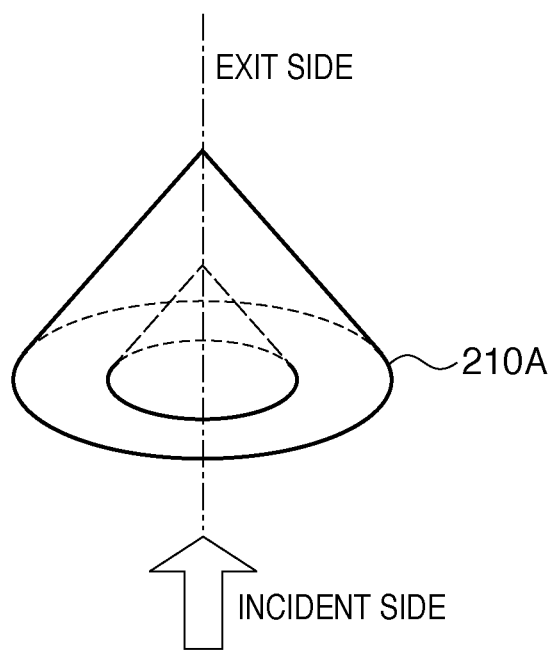
FIG. 4 is a view showing a prism serving as an illumination shape conversion unit for forming the effective light source shape shown in FIG. 3.

For example, a case in which an effective light source having an annular light-emitting portion, as shown in FIG. 3, is formed will be considered. In this case, a prism 210A having a concave conical (or flat) surface on its incident side, and a convex conical surface on its exit side, as shown in FIG. 4, need only be used as the illumination shape conversion unit 210 of the second optical unit OU2. Note that FIG. 3 is a view showing an example of the effective light source shape (an annular effective light source). FIG. 4 is a view showing the prism 210A serving as the illumination shape conversion unit 210 for forming the effective light source shape shown in FIG. 3.

Figure 5:
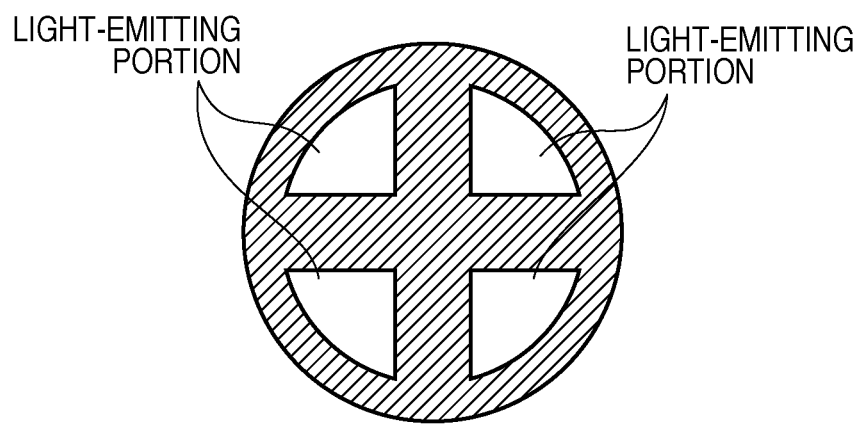
FIG. 5 is a view showing another example of the effective light source shape (a quadrupole effective light source).
Figure 6:
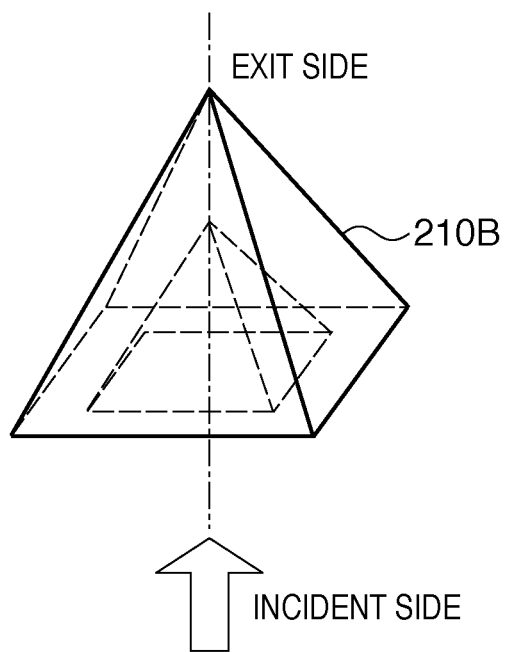
FIG. 6 is a view showing a prism serving as an illumination shape conversion unit for forming the effective light source shape shown in FIG. 5.

Also, a case in which an effective light source having a quadrupole light-emitting portion, as shown in FIG. 5, is formed will be considered. In this case, a prism 210B having a concave quadrangular pyramidal (or flat) surface on its incident side, and a convex quadrangular pyramidal surface on its exit side, as shown in FIG. 6, need only be used as the illumination shape conversion unit 210 of the second optical unit OU2. The angles between the optical axis and the edges of the quadrangular pyramidal surfaces of the prism 210B on its incident and exit sides may be equal to each other or may be different from each other in order to improve the illumination efficiency. Alternatively, a first light intensity distribution formed by the first optical unit OU1 (diffraction optical element 204) may have a quadrupole shape, and a prism having a concave conical (or flat) surface on its incident side, and a convex conical surface on its exit side may be used as the illumination shape conversion unit 210. Note that FIG. 5 is a view showing an example of the effective light source shape (a quadrupole effective light source). FIG. 6 is a view showing the prism 210B serving as the illumination shape conversion unit 210 for forming the effective light source shape shown in FIG. 5.

The use of a pair of prisms which can relatively move in the optical axis direction as the illumination shape conversion unit 210 allows the formation of more various types of effective light source shapes. In other words, this allows an improvement in the degree of freedom of the formation of an effective light source shape.

Figure 7A:
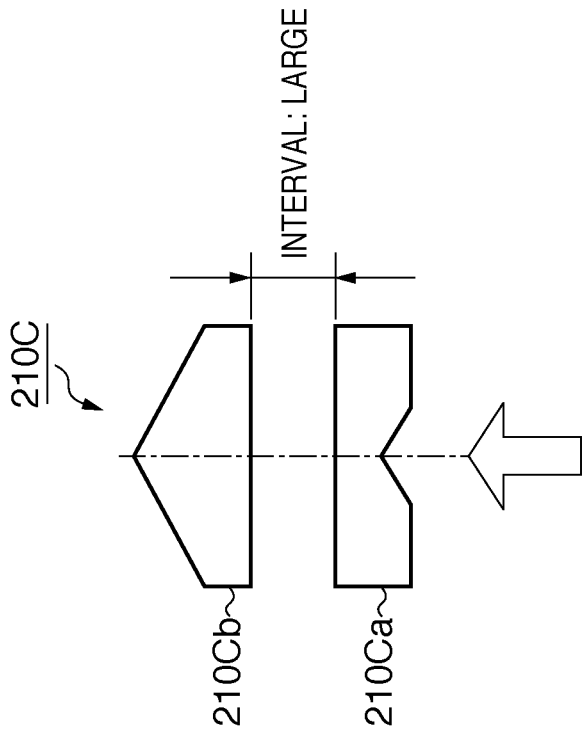
FIGS. 7A and 7B are views each showing an optical member including a pair of prisms as the illumination shape conversion unit.
Figure 7B:
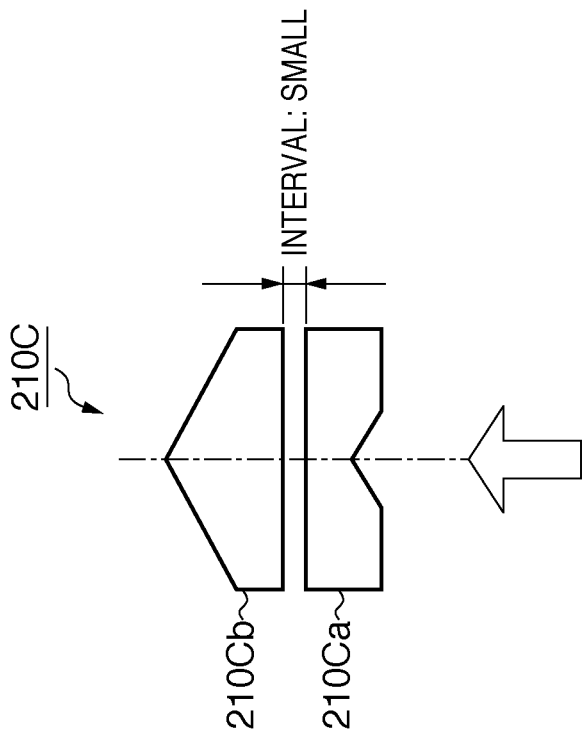

For example, a case in which an optical member 210C including a pair of prisms 210Ca and 210Cb which can relatively move in the optical axis direction, as shown in FIGS. 7A and 7B, is used as the illumination shape conversion unit 210 will be considered. The prism 210Ca has a concave conical surface on its incident side, and a flat surface on its exit side. The prism 210Cb has a flat surface on its incident side, and a convex conical surface on its exit side. Note that FIGS. 7A and 7B are views each showing the optical member 210C including the pair of prisms 210Ca and 210Cb as the illumination shape conversion unit 210.

Figure 8A:
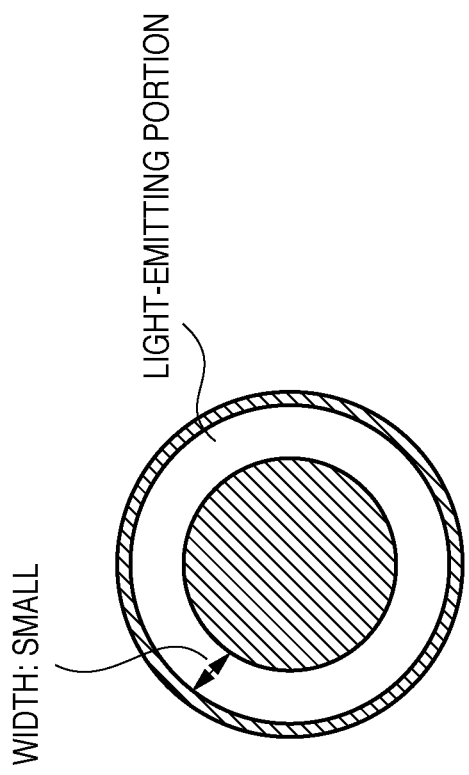
FIGS. 8A and 8B are views showing effective light source shapes formed by the optical members shown in FIGS. 7A and 7B.
Figure 8B:
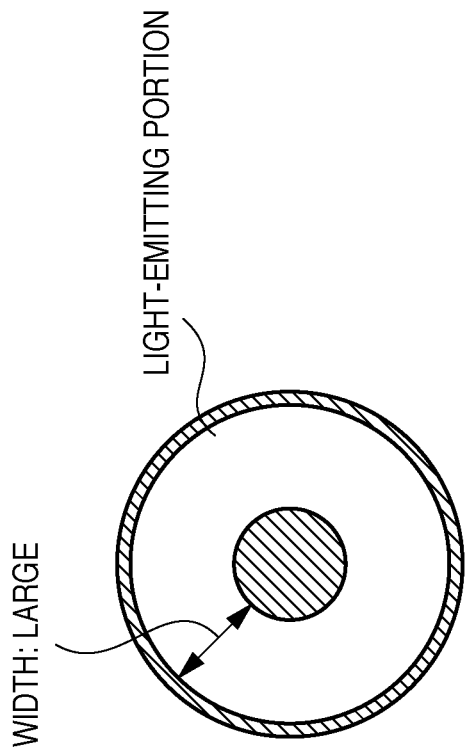

If the interval between the prisms 210Ca and 210Cb is small (FIG. 7A), the optical member 210C forms an annular effective light source having its light-emitting portion with a large width (with a small annular zone ratio), as shown in FIG. 8A. On the other hand, if the interval between the prisms 210Ca and 210Cb is large (FIG. 7B), the optical member 210C forms an annular effective light source having its light-emitting portion with a small width (with a large annular zone ratio), as shown in FIG. 8B. Note that FIGS. 8A and 8B are views each showing an effective light source shape formed by the optical member 210C serving as the illumination shape conversion unit 210.

Combining the illumination shape conversion unit 210 of the second optical unit OU2 and the zoom optical system 212 of the third optical unit OU3 makes it possible to adjust the size of the effective light source shape while keeping the annular zone ratio unchanged. For example, when an annular effective light source is to be formed, it is possible to adjust the ratio between the outer and inner diameters of the annular shape (annular zone ratio) as the width of the light-emitting portion by driving the zoom optical system 212 of the third optical unit OU3. Note that the first optical unit OU1 forms a circular first light intensity distribution, and the second optical unit OU2 forms an annular second light source distribution.

Figure 9B:
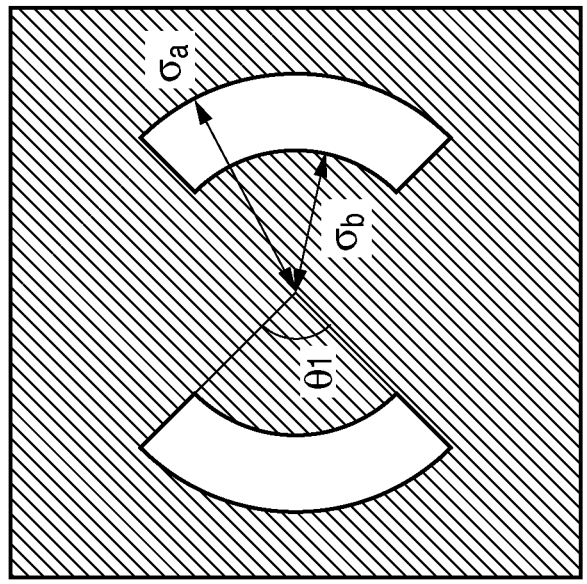
FIGS. 9A and 9B are views for explaining representation of the effective light source (effective light source shape).
Figure 9A:
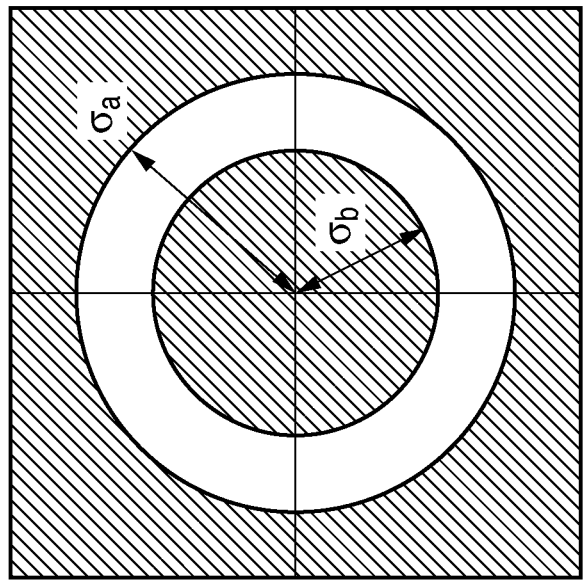

The effective light source (effective light source shape) is generally represented using σ values. The σ value is given by (the numerical aperture of the illumination optical system)/ (the numerical aperture of the projection optical system). For example, in the annular effective light source shown in FIG. 9A, σa and σb are often called the outer σ and inner σ, respectively. Also, in the dipole effective light source shown in FIG. 9B, σa, σb, and θ1 are often called the outer σ, the inner σ, and the angle of aperture, respectively. FIGS. 9A and 9B are views for explaining representation of the effective light source (effective light source shape).

Figure 10:
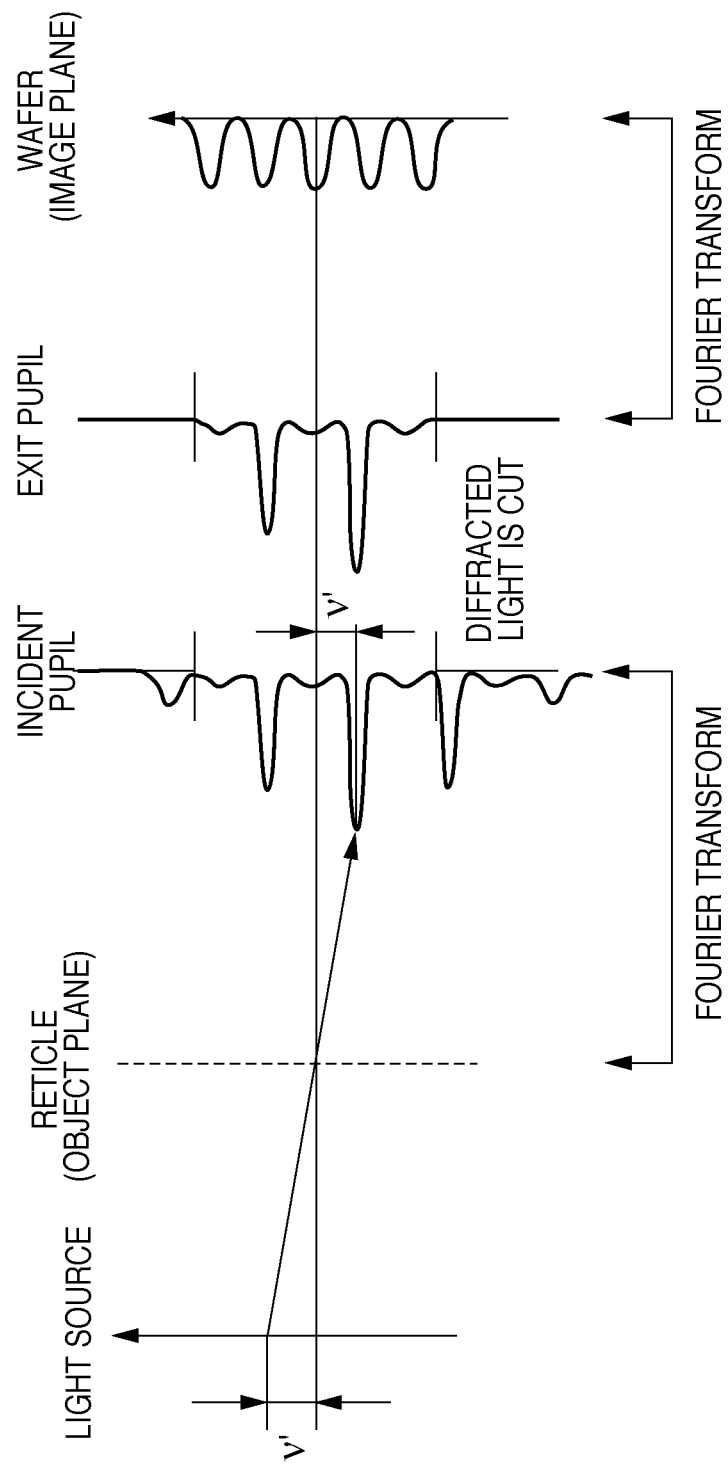
FIG. 10 is a view schematically showing a light intensity distribution that light coming from one point of a light source forms on a wafer (image plane) upon propagating through a reticle (object plane).
Figure 11:
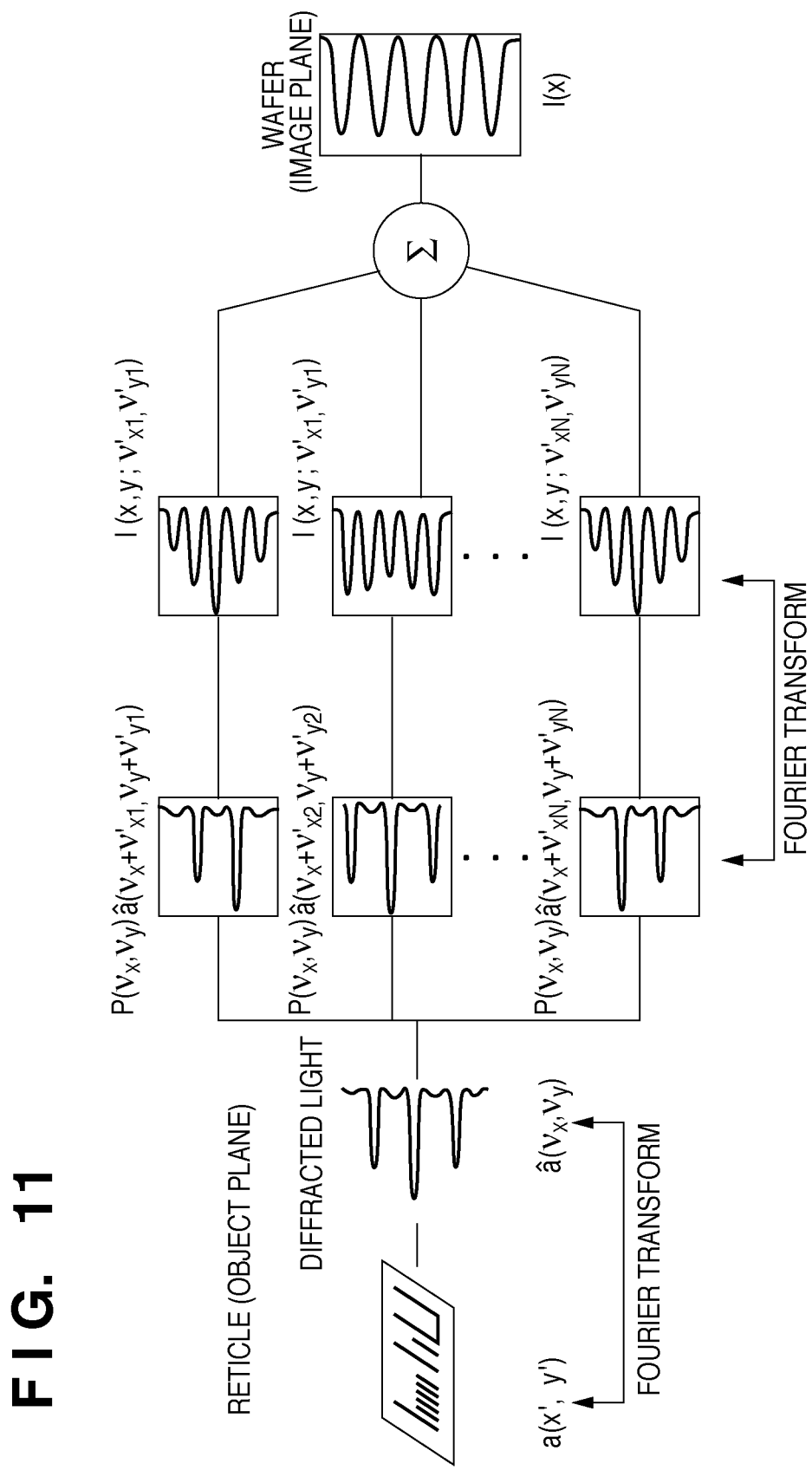
FIG. 11 is a chart schematically showing an optical image calculation method using the Abbe method.

The exposure apparatus 1 exploits partial coherent imaging. In other words, the exposure apparatus 1 illuminates the reticle 30 by partial coherent illumination, thereby projecting the pattern of the reticle 30 onto the wafer 50. The Abbe method is used to calculate an optical image (light intensity distribution) formed on the wafer 50 by dividing the partial coherent illumination light into incoherent point sources. FIG. 10 is a view schematically showing a light intensity distribution that light coming from one point of the light source 10 forms on the wafer 50 (image plane) upon propagating through the reticle 30 (object plane). FIG. 11 is a chart schematically showing an optical image calculation method using the Abbe method. The Abbe method is an algorithm generally employed in optical simulation, so a detailed description thereof will not be given herein.

When calculating an optical image, the control unit 70 needs to receive input information such as pattern information of the reticle 30, information concerning the projection optical system 40, and information of an effective light source shape formed by the illumination optical system 20. The pattern information of the reticle 30 means the information of a pattern to be transferred onto the wafer 50 (that is, to be transferred by exposure), and is generally expressed in the GDS format. The pattern information of the reticle 30 may be pattern data of the reticle 30 or pattern data under design. The information concerning the projection optical system 40 means the parameters of the projection optical system 40, which are necessary for optical simulation, such as the numerical aperture (NA) of the projection optical system 40. To calculate a precise optical image, pupil functions such as aberration distribution information, pupil transmittance distribution information, and polarized light distribution information are preferably input as the information concerning the projection optical system 40.

The control unit 70 can evaluate the optical image using optical simulation instead of actually transferring the pattern of the reticle 30 onto the wafer 50 and analyzing the formed pattern image. The control unit 70 evaluates the optical image while sequentially changing the exposure conditions such as pattern information of the reticle 30, information concerning the projection optical system 40, and information of an effective light source shape formed by the illumination optical system 20, which are input to the control unit 70. This makes it possible to set exposure conditions optimum for the exposure apparatus 1.

The effective light source shape included in the exposure conditions is determined by:
(1) selection of the diffraction optical element 204 in the first optical unit OU1
(2) selection of the illumination shape conversion unit 210 in the second optical unit OU2, and a condition set for the illumination shape conversion unit 210
(3) a condition set for the zoom optical system 212 in the third optical unit OU3
(4) selection of the stop member 216
(5) other factors An example of the "other factors" is a light intensity distribution which is locally and asymmetrically generated in the illumination optical system 20 in the succeeding stage of the diffraction optical element 204 via the propagation path of light from the light source 10. This factor changes for each apparatus due to, for example, deformation of the surface of an optical element which constitutes the illumination optical system 20, a change in the refractive index of the optical element, a deterioration in an antireflection film, and a decrease in the transmittance due to the presence of a substance adhering on the optical element.

Figure 12:
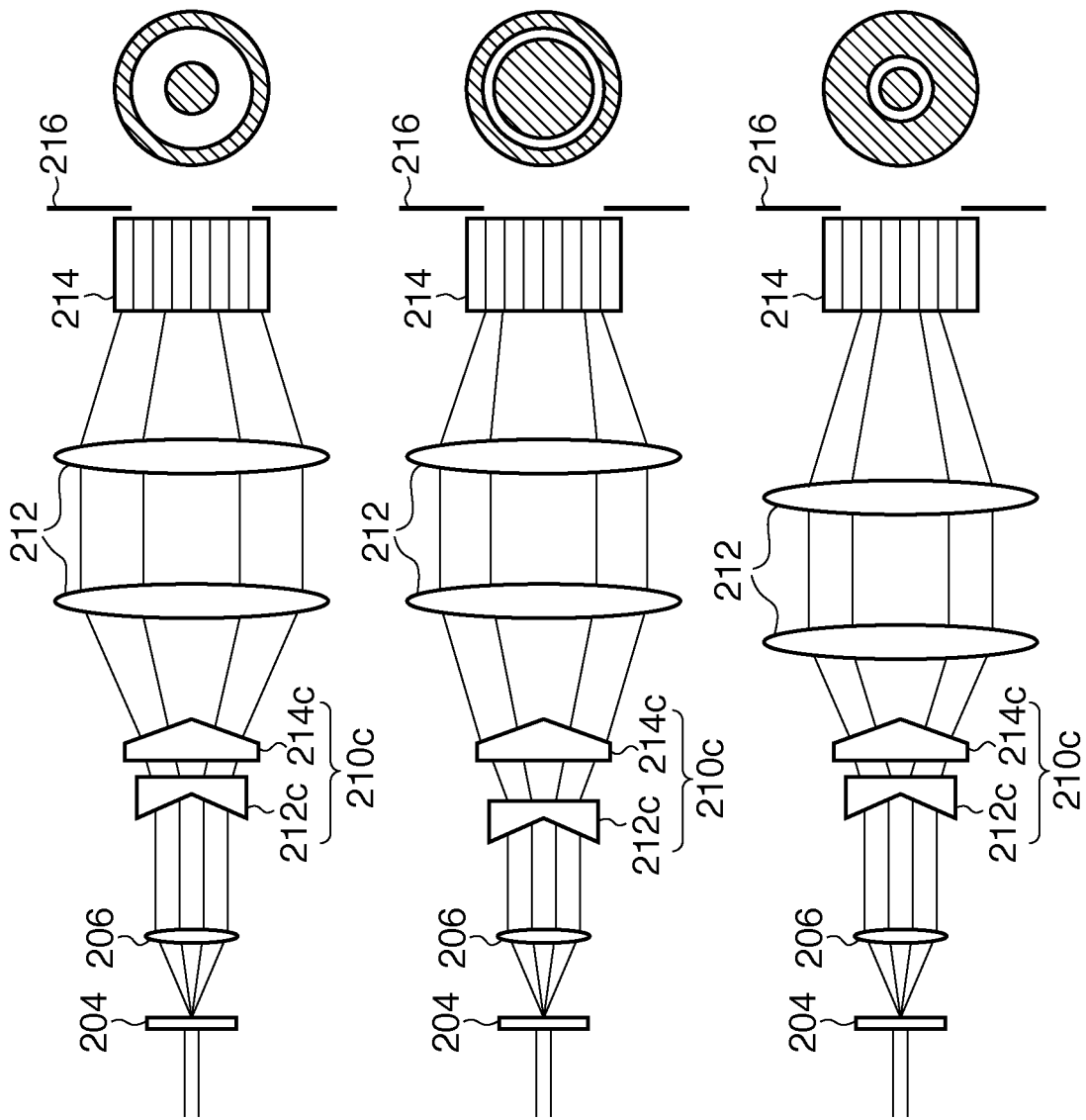
FIGS. 12A to 12C are views each schematically showing the formation of an effective light source by a first optical unit, second optical unit, third optical unit, fly-eye lens, and stop member.

FIGS. 12A to 12C are views each schematically showing the formation of an effective light source by the first optical unit OU1, second optical unit OU2, third optical unit OU3, fly-eye lens 214, and stop member 216. The effective light source shape depends on the selection of the diffraction optical element 204 in the first optical unit OU1, the illumination shape conversion unit 210 in the second optical unit OU2, and the stop member 216, as mentioned above. Referring to FIGS. 12A to 12C, a diffraction optical element for forming an annular effective light source is used as the diffraction optical element 204 of the first optical unit OU1. The optical member 210C including the pair of prisms 210Ca and 210Cb is used as the illumination shape conversion unit 210 of the second optical unit OU2. The annular zone ratio of the annular effective light source can be adjusted, as shown in FIGS. 12A to 12C, in accordance with a condition set for the illumination shape conversion unit 210, that is, (the set amount of) the distance between the prisms 210Ca and 210Cb in the optical member 210C in this embodiment. Likewise, the size of the annular effective light source can be adjusted, as shown in FIGS. 12A to 12C, in accordance with a condition set for the zoom optical system 212, that is, (the set amount of) the distance between the zoom lenses.

A pulse motor (not shown) drives the prisms 210Ca and 210Cb of the optical member 210C, and the zoom lenses of the zoom optical system 212. The control unit 70 controls the distances between the prisms 210Ca and 210Cb and between the zoom lenses based on the number of pulse signals. The driving ranges of the prisms 210Ca and 210Cb and the zoom lenses of the zoom optical system 212 change for each apparatus. For example, the driving range of the prisms 210Ca and 210Cb is defined as 0 to 1,000 pulses, and that of the zoom lenses is defined as 0 to 2,000 pulses. Then, (1000×2000)= 2000000 types of annular effective light sources can be formed by combining the conditions of only the optical member 210C and zoom optical system 212. However, conditions settable for the illumination optical system 20 are not particularly limited to the distances between the prisms 210Ca and 210Cb and between the zoom lenses, and include a plurality of set conditions with regard to the formation of an effective light source.

Figure 13:
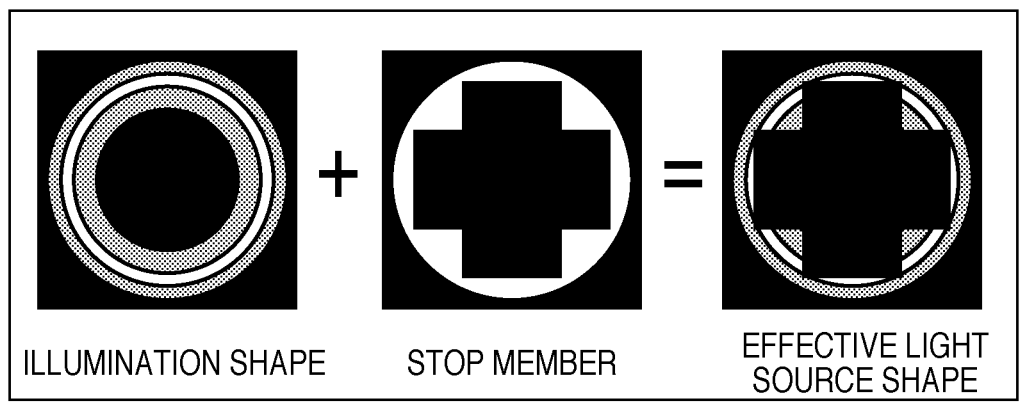
FIG. 13 is a view for explaining an effective light source shape derived from an illumination shape formed by the first optical unit, second optical unit, and third optical unit, and the aperture shape of the stop member.

An effective light source shape is derived by superposing the aperture shape of the stop member 216 onto an illumination shape formed by the first optical unit OU1, second optical unit OU2, and third optical unit OU3, as shown in FIG. 13. FIG. 13 is a view for explaining an effective light source shape derived from an illumination shape formed by the first optical unit OU1, second optical unit OU2, and third optical unit OU3, and the aperture shape of the stop member 216.

The stop member 216 can not only be a variable aperture stop for shielding any stray light, as shown in FIG. 14A, but also be a stop for forming a dipole effective light source, as shown in FIG. 14B. In addition, the polarization state of the effective light source can be controlled using phase plates as shown in FIG. 14C. In this case, the effective light source shape includes the polarization state. FIGS. 14A to 14C are views each showing the configuration of the stop member 216. The arrows in FIG. 14C indicate the fast axes of the respective phase plates.

Compilation of effective light source shapes formed in the illumination optical system 20 of the exposure apparatus 1 into a database will be explained herein.

To compile effective light source shapes into a database, there is a method which uses the result of a ray trace based on information of the illumination optical system 20 (selection of the diffraction optical element 204, and a plurality of conditions settable for the illumination optical system 20).

Figure 15:
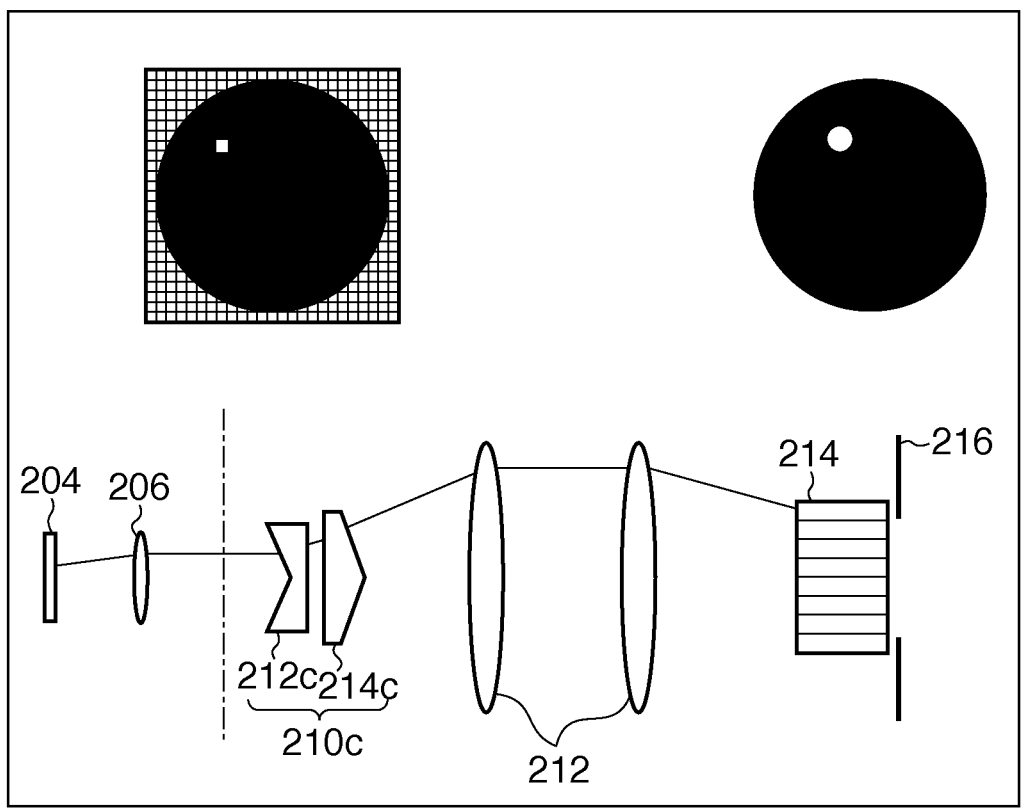
FIG. 15 is a view for explaining a ray trace used to compile effective light source shapes into a database.

More specifically, a first light intensity distribution formed by the first optical unit OU1 including the diffraction optical element 204 is divided into pixels in a finite region, as shown in FIG. 15. On the assumption that each pixel has a point source, a ray trace for the light coming from the point source and propagating through the second optical unit OU2 and third optical unit OU3 is performed. This makes it possible to obtain an effective light source (effective light source shape) formed by the first light intensity distribution. A ray trace basically needs to be performed a number of times equal to the product of the division number of pixels on the first light intensity distribution, and the number of conditions settable for the illumination optical system 20. For example, assuming that the division number of pixels on the first light intensity distribution is 64×64, a ray trace needs to be performed (4096×1000×2000) times. However, considering the symmetry of the design of the illumination optical system 20 and the like, a ray trace need not always be performed for all pixels to be able to improve its efficiency. Note that FIG. 15 is a view for explaining a ray trace used to compile effective light source shapes into a database.

Performing such a ray trace for a plurality of conditions settable for the illumination optical system 20 makes it possible to obtain effective light source shapes corresponding to these conditions. This makes it possible to compile effective light source shapes formed in the exposure apparatus 1 into a database, as shown in FIG. 16.

Figure 16:
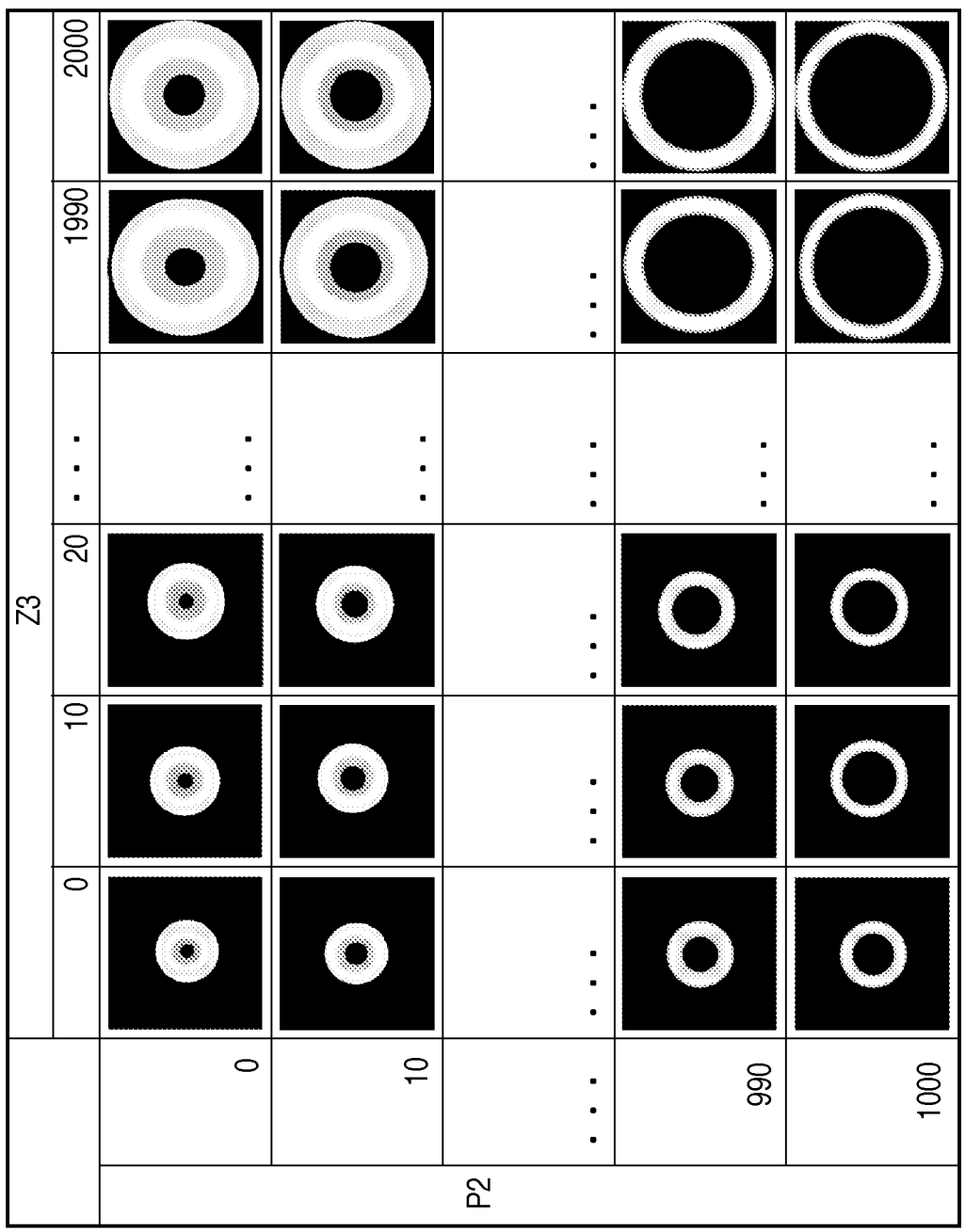
FIG. 16 is a view showing a database of effective light source shapes.

FIG. 16 is a view showing a database of effective light source shapes when a condition settable for the second optical unit OU2 is defined by P2, and that settable for the third optical unit OU3 is defined by Z3. The condition P2 is a pulse number representing (the set value) of the distance between the prisms 210Ca and 210Cb in the optical member 210C. The condition Z3 is a pulse number representing (the set value) of the distance between the zoom lenses in the zoom optical system 212. Although the effective light source shape is visualized in the BMP format in FIG. 16, it may be represented using, for example, the above-mentioned σ values.

The database of effective light source shapes, shown in FIG. 16, is generated based on conditions (ideal values or design values) set for the illumination optical system 20. Note that effective light source shapes actually formed in the exposure apparatus 1 differ from the effective light source shapes in the database shown in FIG. 16, due to the other factors and errors (for example, manufacturing errors and driving errors of the optical elements) contained in the set conditions, as mentioned above.

It is impractical to set all of a plurality of conditions settable for the illumination optical system 20 and measure the effective light source shapes, thereby generating a database of effective light source shapes based on the obtained measurement result, in order to generate a database of effective light source shapes actually formed in the illumination optical system 20.

For example, to generate a database of annular effective light sources, it is necessary to measure effective light source shapes corresponding to the respective conditions of the second optical unit OU2 and third optical unit OU3 while the light aperture value of the stop member 216 is minimum. In this case, measurement of the effective light source shape needs to be repeated while continuously changing the set value of the distance between the prisms 210Ca and 210Cb, and the distance between the zoom lenses of the zoom optical system 212 (that is, while driving them little by little). Furthermore, measurement of the effective light source shape needs to be performed a number of times equal to the product of the number of settable diffraction optical elements 204 and the number of conditions settable for the illumination optical system 20.

To solve this problem, in this embodiment, a database of effective light sources close to those actually formed in the illumination optical system 20 is generated using both a method which uses the result of a ray trace, and a method of measuring the effective light source shape.

FIG. 17 is a flowchart for explaining a method of generating a database of effective light source shapes formed in the illumination optical system 20 of the exposure apparatus 1 (database generation processing).

In step S1002, the effective light source shapes are calculated while changing a plurality of conditions settable for the illumination optical system 20, thereby generating an initial database representing effective light source shapes corresponding to these conditions. More specifically, using, for example, the above-mentioned ray trace, effective light source shapes corresponding to a plurality of conditions settable for the illumination optical system 20 are obtained and compiled into a database. With this operation, the database as shown in FIG. 16 is obtained as the initial database. However, the initial database of effective light source shapes calculated based on conditions set for the illumination optical system 20 may be generated in advance (or separately).

In step S1004, an arbitrary condition of the plurality of conditions settable for the illumination optical system 20 is actually set for the illumination optical system 20, and the effective light source shapes are measured. More specifically, P2=990 and Z3=1990 are set for the illumination optical system 20 as the conditions of the second optical unit OU2 and third optical unit OU3, respectively, and the effective light source shapes are measured using the detection unit 60.

In step S1006, the effective light source shapes in the initial database generated in step S1002, and those measured in step S1004 are compared. The difference amounts between the effective light source shapes in the initial database generated in step S1002, and those measured in step S1004 are calculated. More specifically, of the effective light source shapes included in the database shown in FIG. 16, effective light source shapes corresponding to the conditions P2=990 and Z3=1990 set for the second optical unit OU2 and third optical unit OU3, respectively, and the measured effective light source shapes are compared. At this time, normalization processing is performed so as to match the area integrals of the light intensities corresponding to the effective light source shapes between these conditions. Calculating two-dimensional differences in light intensities yields the difference amounts of effective light source shapes corresponding to the conditions P2=990 and Z3=1990 set for the second optical unit OU2 and third optical unit OU3, respectively.

In step S1008, the difference functions with respect to a plurality of conditions settable for the illumination optical system 20 (that is, the difference amounts with respect to all of a plurality of conditions settable for the illumination optical system 20) are calculated based on the difference amounts calculated in step S1006. More specifically, the difference functions are calculated by representing the difference amounts by, for example, polynomial functions Iij with respect to the conditions P2 and Z3 for the second optical unit OU2 and third optical unit OU3, respectively, as given by:

$$Iij = \sum_n Cnij * Z3^n + \sum_m Cmij * P2^m \tag{1}$$

where i and j are the grid numbers in the x and y directions, respectively, when the effective light source is divided in a grid pattern.

Note that, to accurately calculate the difference functions, it is preferable to actually set, for the illumination optical system 20, at least two conditions of the plurality of conditions settable for the illumination optical system 20, and use the result of measuring effective light source shapes corresponding to these conditions in step S1004.

The difference functions can be calculated as orthogonal functions such as Zernike polynomials given by:

$z1=1$
$z2=\rho \cos \theta$
$z3=\rho \sin \theta$
$z4=-1+2\rho^2$
$z5=\rho^2 \cos 2\theta$
$z6=\rho^2 \sin 2\theta$
$z7=\rho(-2+3\rho^2)\cos \theta$
$z8=\rho(-2+3\rho^2)\sin \theta$
$z9=1-6\rho^2+6\rho^4$
$z10=\rho^3 \cos 3\theta$
$z11=\rho^3 \sin 3\theta$
$z12=\rho^2(-3+4\rho^2)\cos 2\theta$
$z13=\rho^2(-3+4\rho^2)\sin 2\theta$
$z14=\rho(3-12\rho^2+10\rho^4)\cos \theta$
$z15=\rho(3-12\rho^2+10\rho^4)\sin \theta$
$z16=-1+12\rho^2 30\rho^4+20\rho^6$
$z17=\rho^4 \cos 4\theta$
$z18=\rho^4 \sin 4\theta$
$z19=\rho^3(-4+5\rho^2)\cos 3\theta$
$z20=\rho^3(-4+5\rho^2)\sin 3\theta$
$z21=\rho^2(6-20\rho^2+15\rho^4)\cos 2\theta$
$z22=\rho^2(6-20\rho^2+15\rho^4)\sin 2\theta$
$z23=\rho(-4+30\rho^2-60\rho^4+35\rho^6)\cos \theta$
$z24=\rho(-4+30\rho^2-60\rho^4+35\rho^6)\sin \theta$
$z25=1-20\rho^2+90\rho^4-140\rho^6+70\rho^8$
$z26=\rho^5 \cos 5\theta$
$z27=\rho^5 \sin 5\theta$
$z28=\rho^4(-5+6\rho^2)\cos 4\theta$
$z29=\rho^4(-5+6\rho^2)\sin 4\theta$
$z30=\rho^3(10-30\rho^2+21\rho^4)\cos 3\theta$
$z31=\rho^3(10-30\rho^2+21\rho^4)\sin 3\theta$
$z32=\rho^2(-10+60\rho^2-105\rho^4+56\rho^6)\cos 2\theta$
$z33=\rho^2(-10+60\rho^2-105\rho^4+56\rho^6)\sin 2\theta$
$z34=\rho(5-60\rho^2+210\rho^4-280\rho^6+126\rho)\cos \theta$
$z35=\rho(5-60\rho^2+210\rho^4-280\rho^6+126\rho^3)\sin \theta$
$z36=-1+30\rho^2-210\rho^4+560\rho^6-630\rho^8+252\rho^{10}$ In step S1010, the effective light source shapes included in the initial database generated in step S1002 are corrected using the difference functions calculated in step S1008, and compiled into an actual database. This makes it possible to generate a database of effective light source shapes close to actually formed effective light source shapes while considerably decreasing the number of times of measurement of an actual effective light source shape.

The difference amounts calculated in step S1006 can be approximately regarded as being constant under conditions close to the conditions P2=990 and Z3=1990 of the second optical unit OU2 and third optical unit OU3, respectively. For this reason, if a database of only effective light source shapes corresponding to conditions close to those actually set for the illumination optical system 20 in step S1004 is necessary, the effective light source shapes may be corrected using the difference amounts and compiled into an actual database without calculating the difference functions.

In this embodiment, the difference amount or difference function is assumed as a difference in light intensity corresponding to the effective light source shape. However, the difference amount or difference function may be represented using the peak σ value (a value) of the light intensity and the range (b value) of a σ value having a light intensity equal to or higher than ⅓ that of the peak σ value in an annular effective light source, as shown in FIG. 18A.

Figures 18A, 18B:
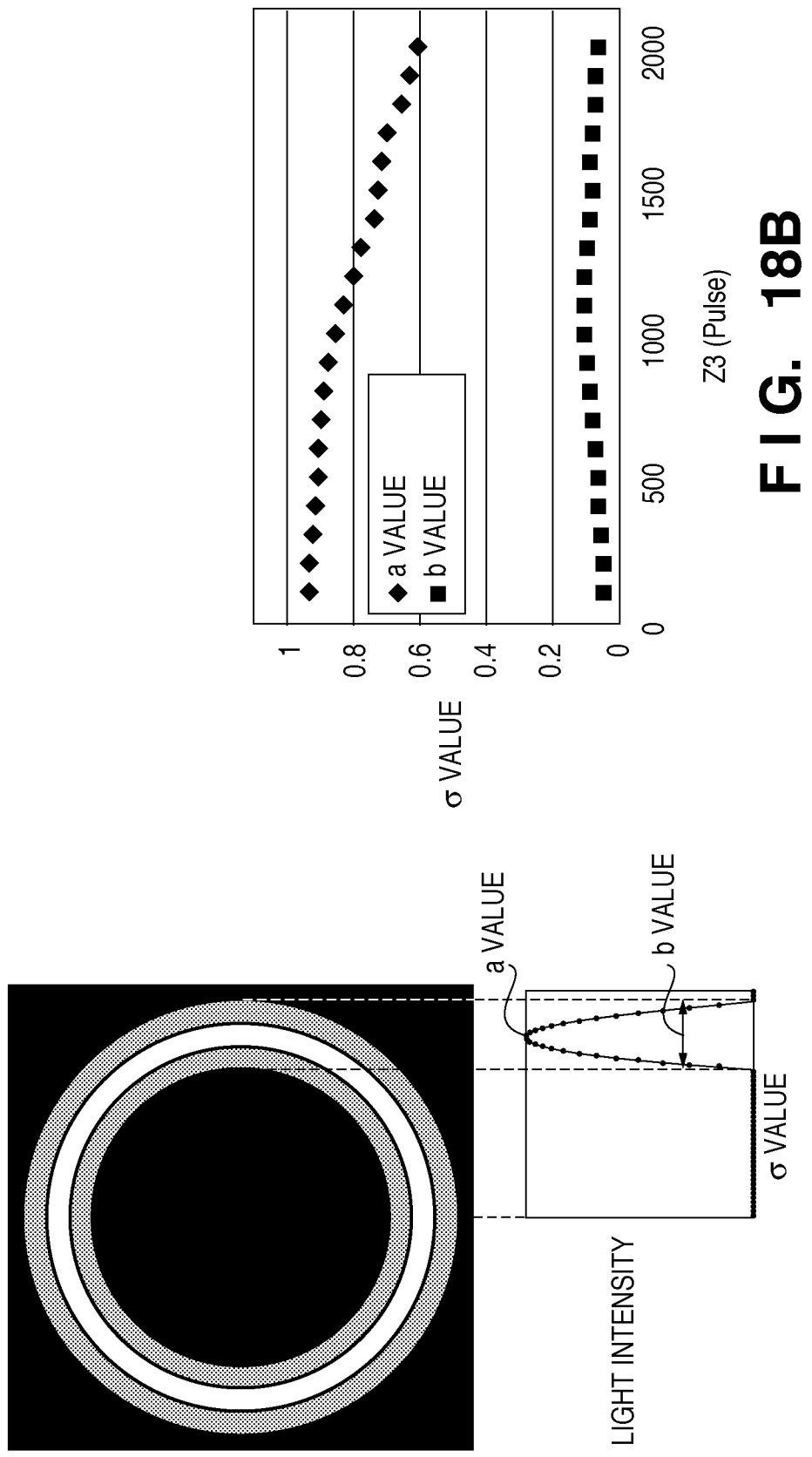
FIGS. 18A and 18B are graphs for explaining another example of the difference amounts calculated in step S1006 of FIG. 17, and the difference functions calculated in step S1008 of FIG. 17.

FIG. 18B is a graph showing the a and b values when the condition P2 of the second optical unit OU2 is constant, and the condition Z3 of the third optical unit OU3 is changed from 0 to 2,000 pulses. In other words, FIG. 18B shows a state in which the effective light source shape changes in response to a change in the size of the effective light source while the annular zone ratio of an annular effective light source is fixed. Note that FIG. 18B shows the result of calculating an effective light source shape based on conditions set for the illumination optical system 20.

Referring to FIG. 18B, the b value is not constant despite the fact that the condition P2 for changing the annular zone ratio is constant. This reveals that the effective light source shape continuously changes under a plurality of conditions settable for the illumination optical system 20.

An arbitrary condition is set for the third optical unit OU3, an actual effective light source shape is measured, and the peak σ value (a' value) of the light intensity and the range (b' value) of a σ value having a light intensity equal to or higher than ⅓ that of the peak σ value in the measured effective light source shape are extracted. A difference amount Δa ((a value)−(a' value)) of the peak σ value, and a difference value Δb ((b value)−(b' value)) of the range of a σ value having a light intensity equal to or higher than ⅓ that of the peak σ value are calculated. The a and b values in the graph shown in FIG. 18B are corrected using the difference amounts Δa and Δb, and effective light source shapes corresponding to these values are compiled into an actual database. This makes it possible to generate a database of effective light source shapes close to actually formed effective light source shapes. The difference amounts Δa and Δb can also be represented as the functions (difference functions) with respect to the conditions P2 and Z3 of the second optical unit OU2 and third optical unit OU3, respectively. Although the magnitude of the σ value is set at a position indicating the peak of the light intensity, and the range of the σ value is set at a position corresponding to an intensity ⅓ that of the peak, the definition of the magnitude and range of the σ value are not particularly limited to this. Also, although the light intensity is used as an index of the magnitude of the σ value, an area integral obtained by integrating the light intensity distribution in the radial direction may be used as an index of the magnitude of the σ value.

In this manner, according to this embodiment, it is possible to easily generate a database of effective light source shapes close to actually formed effective light source shapes. The use of this database allows an improvement in the calculation accuracy of the lithography simulator.

More specifically, when calculating an optical image, the control unit 70 receives effective light source shapes included in the database generated in this embodiment as input information. This makes it possible to accurately calculate an actual optical image formed on the wafer 50. Also, when setting the exposure conditions including the effective light source shape by repeating the calculation of an optical image while changing the effective light source shape and other exposure conditions, the control unit 70 receives effective light source shapes in the database generated in this embodiment as input information. This makes it possible to optimize (set) the exposure conditions with a higher accuracy than ever.

In exposure, a light beam emitted by the light source 10 illuminates the reticle 30 via the illumination optical system 20. The light beam which bears the information of the pattern of the reticle 30 upon being transmitted through the reticle 30 forms an image on the wafer 50 by the projection optical system 40. Because the exposure apparatus 1 can optimize the exposure conditions with a higher accuracy than ever, as mentioned above, it can provide devices (e.g., a semiconductor device, an LCD device, an image sensing element (e.g., a CCD), and a thin-film magnetic head) with a high throughput and a good economical efficiency. These devices are fabricated by a step of exposing a substrate (e.g., a wafer or glass plate) coated with a photoresist (photosensitive agent) using the exposure apparatus 1, a step of developing the exposed substrate, and other known steps.

An effective light source shape database generation method (database generation) according to this embodiment can easily generate a database of effective light source shapes close to actually formed effective light source shapes by eliminating the influence of any individual differences between exposure apparatuses of the same model.

For example, a case in which a database of effective light source shapes formed in an illumination optical system of a second exposure apparatus is generated using a database of effective light source shapes used in a first exposure apparatus will be considered. Note that the first and second exposure apparatuses are of the same model, and conditions settable for their illumination optical systems are the same.

First, a database representing effective light source shapes corresponding to a plurality of conditions settable for the illumination optical system of the first exposure apparatus is obtained as the initial database.

Second, an arbitrary condition of the plurality of conditions settable for the second exposure apparatus is actually set for the illumination optical system of the second exposure apparatus, and the effective light source shape is measured.

Third, based on the effective light source shape included in the initial database and the measured effective light source shape, the difference amount between an effective light source shape when each of the plurality of conditions is actually set for the illumination optical system of the second exposure apparatus and the effective light source shape included in the initial database is calculated.

Lastly, the effective light source shapes included in the initial database are corrected using the calculated difference amounts, and compiled into an actual database.

In this manner, the above-mentioned generation method can eliminate any difference in effective light source shape due to the influence of the individual differences between the first and second exposure apparatuses, while the database of effective light source shapes used in the first exposure apparatus is used as the initial database. It is therefore possible to easily generate a database of effective light source shapes close to those actually formed in the illumination optical system of the second exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-032348 filed on Feb. 13, 2008, which is hereby incorporated by reference herein in its entirety.

What is claimed is:

1. In an exposure apparatus including an illumination optical system which illuminates an original with light from a light source, and a projection optical system which projects a pattern of the original onto a substrate, a method of generating a database of effective light source distributions formed in the illumination optical system, the method comprising:

a generation step of calculating effective light source distributions while changing a plurality of conditions settable for the illumination optical system, and generating an initial database including the calculated effective light source distributions corresponding to the plurality of conditions;

a measurement step of setting a first condition of the plurality of conditions for the illumination optical system, and measuring an effective light source distribution corresponding to the first condition;

a calculation step of calculating, based on a difference amount between the measured effective light source distribution, and the calculated effective light source distribution corresponding to the first condition included in the initial database, a difference function representing difference amounts of the calculated effective light source distributions corresponding to conditions different from the first condition included in the initial database, the difference function being a function of a condition settable for the illumination optical system; and a correction step of correcting the calculated effective light source distribution corresponding to each of the plurality of conditions including the conditions different from the first condition included in the initial database using the difference function, and compiling the corrected effective light source distribution into an actual database.

2. The method according to claim 1, wherein in the calculation step, the difference amount is calculated as an orthogonal function.

3. The method according to claim 1, wherein in the measurement step, at least two conditions of the plurality of conditions including the first condition are set for the illumination optical system, and effective light source distributions corresponding to said at least two conditions are measured.

4. Of a first exposure apparatus and a second exposure apparatus each including an illumination optical system which illuminates an original with light from a light source, and a projection optical system which projects a pattern of the original onto a substrate, a method of generating a database of effective light source distributions formed in the illumination optical system of the second exposure apparatus, the method comprising:

an obtaining step of obtaining, as an initial database, a database including effective light source distributions corresponding to a plurality of conditions settable for the illumination optical system of the first exposure apparatus;

a measurement step of setting, for the illumination optical system of the second exposure apparatus, a first condition of the plurality of conditions settable for the illumination optical system of the second exposure apparatus, and measuring an effective light source distribution corresponding to the first condition;

a calculation step of calculating, based on a difference amount between the measured effective light source distribution, and the obtained effective light source distribution corresponding to the first condition included in the initial database, a difference function representing difference amounts of the obtained effective light source distributions corresponding to conditions different from the first condition included in the initial database, the difference function being a function of a condition settable for the illumination optical system of the second exposure apparatus; and a correction step of correcting the obtained effective light source distribution corresponding to each of the plurality of conditions including the conditions different from the first condition included in the initial database using the difference function, and compiling the corrected effective light source distribution into an actual database.

5. A method of calculating an optical image formed on an image plane of a projection optical system in an exposure apparatus including an illumination optical system which illuminates an original with light from a light source, and the projection optical system which projects a pattern of the original onto the substrate, the method comprising:
 a database generation step of generating a database of effective light source distributions formed in the illumination optical system; and
 a calculation step of receiving, as input information, the effective light source distributions included in the database generated in the database generation step, the pattern of the original, and information concerning the projection optical system, and calculating an optical image formed on the image plane of the projection optical system based on the input information,
the database generation step including:
 a generation step of calculating effective light source distributions while changing a plurality of conditions settable for the illumination optical system, and generating an initial database including the calculated effective light source distributions corresponding to the plurality of conditions,
 a measurement step of setting a first condition of the plurality of conditions for the illumination optical system, and measuring an effective light source distribution corresponding to the first condition,
 a calculation step of calculating, based on a difference amount between the measured effective light source distribution, and the calculated effective light source distribution corresponding to the first condition included in the initial database, a difference function representing difference amounts of the calculated effective light source distributions corresponding to conditions different from the first condition included in the initial database, the difference function being a function of a condition settable for the illumination optical system, and
 a correction step of correcting the calculated effective light source distribution corresponding to each of the plurality of conditions including the conditions different from the first condition included in the initial database using the difference function, and compiling the corrected effective light source distribution into an actual database.

6. A non-transitory recording medium recording a program for making a computer calculate an optical image formed on an image plane of a projection optical in an exposure apparatus including an illumination optical system which illuminates an original with light from a light source, and the projection optical system which projects a pattern of the original onto the substrate, the program making the computer execute:
 a database generation step of generating a database of effective light source distributions formed in the illumination optical system; and
 a calculation step of receiving, as input information, the effective light source distributions included in the database generated in the database generation step, the pattern of the original, and information concerning the projection optical system, and calculating an optical image formed on the image plane of the projection optical system based on the input information,
wherein the database generation step includes:
 a generation step of calculating effective light source distributions while changing a plurality of conditions settable for the illumination optical system, and generating an initial database including the calculated effective light source distributions corresponding to the plurality of conditions,
 a measurement step of setting a first condition of the plurality of conditions for the illumination optical system, and measuring an effective light source distribution corresponding to the first condition,
 a calculation step of calculating, based on a difference amount between the measured effective light source distribution, and the calculated effective light source distribution corresponding to the first condition included in the initial database, a difference function representing difference amounts of the calculated effective light source distributions corresponding to conditions different from the first condition included in the initial database, the difference function being a function of a condition settable for the illumination optical system, and
 a correction step of correcting the calculated effective light source distribution corresponding to each of the plurality of conditions including the conditions different from the first condition included in the initial database using the difference function, and compiling the corrected effective light source distribution into an actual database.

7. An exposure method for an exposure apparatus including an illumination optical system which illuminates an original with light from a light source, and a projection optical system which projects a pattern of the original onto a substrate, the method comprising:
 a database generation step of generating a database of effective light source distributions formed in the illumination optical system;
 a calculation step of receiving, as input information, the effective light source distributions included in the database generated in the database generation step, the pattern of the original, and information concerning the projection optical system, and calculating an optical image formed on an image plane of the projection optical system based on the input information;
 a setting step of setting an exposure condition of the exposure apparatus based on evaluation of the optical image calculated in the calculation step;
 an illumination step of illuminating the original under the exposure condition set in the setting step; and
 a projection step of projecting an image of the pattern of the original illuminated in the illumination step onto the substrate via the projection optical system,
wherein the database generation step includes:
 a generation step of calculating effective light source distributions while changing a plurality of conditions settable for the illumination optical system, and generating an initial database including the calculated effective light source distributions corresponding to the plurality of conditions,
 a measurement step of setting a first condition of the plurality of conditions for the illumination optical system, and measuring an effective light source distribution corresponding to the first condition,
 a calculation step of calculating, based on a difference amount between the measured effective light source distribution, and the calculated effective light source distribution corresponding to the first condition included in the initial database, a difference function representing difference amounts of the calculated effective light source distributions corresponding to conditions different from the first condition included in the initial database, the difference function being a function of a condition settable for the illumination optical system, and a correction step of correcting the calculated effective light source distribution corresponding to each of the plurality of conditions including the conditions different from the first condition included in the initial database using the difference function, and compiling the corrected effective light source distribution into an actual database.

8. A device fabrication method comprising steps of:

exposing a substrate using an exposure method according to claim 7; and performing a development process for the substrate exposed.

9. The method according to claim 1, wherein the difference amount is a difference amount of a peak of light intensity of the effective light source distribution.

10. The method according to claim 1, wherein the condition settable for the illumination optical system is distance between optical elements of the illumination optical system.

11. The method according to claim 1, wherein the difference function is represented by polynomial functions with respect to the each of the plurality of conditions.

\* \* \* \* \*